(12) United States Patent
Uchiyama

(10) Patent No.: US 6,979,809 B2
(45) Date of Patent: Dec. 27, 2005

(54) IMAGE READING APPARATUS

(75) Inventor: Nobuyuki Uchiyama, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/611,929

(22) Filed: Jul. 3, 2003

(65) Prior Publication Data

US 2004/0004177 A1 Jan. 8, 2004

(30) Foreign Application Priority Data

Jul. 8, 2002 (JP) .................................... 2002-198817

(51) Int. Cl.[7] .............................................. H04N 1/04
(52) U.S. Cl. ............................ 250/208.1; 250/214 R; 358/1.13; 358/497
(58) Field of Search .................. 250/208.1, 214 R, 250/234, 235; 358/1.13, 1.15, 474, 486, 494, 497

(56) References Cited

U.S. PATENT DOCUMENTS 6,594,038 B1 * 7/2003 Ikeda .......................... 358/486

* cited by examiner

Primary Examiner—Kevin Pyo
(74) Attorney, Agent, or Firm—Fitzpatrick, Cella, Harper & Scinto

(57) ABSTRACT

Among users, there are two kinds of users, i.e., users who want to give priority to resolution and users who want to give priority to gradation, and reading modes desired by the respective users could not be provided by a single product. In the image reading apparatus having a light source for applying light to an image, moving means for moving a carriage unit including the light source, a CCD for converting reflected light into a voltage, an A/D converter for converting an analog signal outputted from the CCD into a digital signal, and a driving signal generating part for supplying a driving signal to the CCD and the A/D converter, the moving speed of the carriage unit is not changed, but there are held a plurality of kinds of signal patterns supplied by the driving signal generating part.

5 Claims, 14 Drawing Sheets

IMAGE READING APPARATUS

BACKGROUND OF THE INVENTION

1. Field of the Invention

This invention relates to an image reading apparatus.

2. Description of Related Art

The construction of a conventional image reading apparatus will hereinafter be described with reference to FIGS. 12 to 14 of the accompanying drawings.

In FIG. 12, the reference numeral 1201 designates an image reading apparatus (hereinafter referred to as the image scanner) for reading an image, and the reference numeral 1202 denotes an auto document feeder (hereinafter referred to as the ADF) for automatically successively feeding a plurality of originals one by one.

The reference numeral 1203 in the image scanner 1201 designates copy board glass, and an original 1204 is placed on the copy board glass 1203 and a desired image is read. The procedure of reading the image will hereinafter be described briefly.

The reference numeral 1205 denotes a light source for applying light to the original, and generally when the read image is to be outputted in black and white, a yellow green light source is used, and when the read image is to be outputted in colors, a white light source is used. As the kinds of the light source, various kinds of light sources such as a cold cathode tube, a halogen lamp and a xenon lamp are used depending on the uses thereof.

Reflected light 1206 applied from the light source 1205 to the original is reflected by a first mirror 1207, a second mirror 1208 and a third mirror 1209, is condensed by a lens unit 1210 and is imaged on a CCD 1211 which is a photoelectric conversion element.

The light information of the imaged light is converted into a voltage by the CCD 1211, is further converted from an analog signal to a digital signal, and thereafter is subjected to a series of correcting processes such as shading correction, black level correction and gamma correction, and is outputted to a monitor, a file or the like.

The constituents from the light source 1205 to the CCD 1211 are constituted as a carriage unit 1212 by a unit. A reading optical system thus containing the constituents of the optical system in a carriage unit, if dimensional accuracy in the carriage unit 1212 is controlled, has the merit that the quality of the read image is not spoiled even if other dimensional accuracy is not finely controlled.

Also, the reference numeral 1213 designates a white reference plate constructed at a location which cannot be seen from an original placing surface, and upon closing of a power source switch or at the timing immediately before image reading, the light source 1205 is turned on and the white reference plate 1213 is read to thereby detect the offset gain adjustment of an A/D converter (not shown) for converting the analog voltage photoelectrically converted by the CCD 1211 into a digital voltage, and the trouble of the light source 1205.

As the popular construction of another reading optical system, there is a 1 to ½ optical system shown in FIG. 13. This reading optical system is of a construction in which a first optical unit 1301 including a light source 1205 and a first mirror 1207, and a second optical unit 1302 including a second mirror 1208 and a third mirror 1209 are movable units, and a lens unit 1210 and a CCD 1211 are fixed. Since the moving speeds of the first optical unit 1301 and the second optical unit 1302 are designed to be 1:½, this reading optical system is called the 1 to ½ optical system. By being designed at such a speed ratio, the distance from a reading position to the CCD is always constant at a+L1+L2+b. This reading optical system has a merit in depth of focus because the distance between an object and an image can be secured long, while on the other hand it becomes necessary to sufficiently control the dimensional accuracy of the entire scanner.

The carriage unit 1212 or the first optical unit 1301 and the second optical unit 1302 are one-dimensional reading units which can read an image of a predetermined width (84.7 $\mu$m at 300 dpi). A one-dimensional image read thereby can be read as the two-dimensional image of the entire original by connecting together images one-dimensionally read while the carriage unit 1212, the first optical unit 1301 and the second optical unit 1302 are moved by a motor (not shown). After the image of the entire original has been read, it is outputted to a personal computer or a monitor or the like.

As described above, an original like a photograph which cannot be bent, a thick original such as a book, or an original to be read with a high quality of image usually has its image read while being place on the copy board glass. On the other hand, for the reading of a plurality of original sheets, there has been carried out a method of collectively reading images by the use of the ADF 1202. It should be noted that in some cases, the carriage unit 1212 is constituted by a CIS module.

The reference numeral 1214 denotes an ADF open detection sensor for detecting whether the ADF 1202 is opened or not.

The detailed construction of the ADF 1202 will now be described with reference to the construction view of FIG. 14.

The reference numeral 1401 designates an original tray for stacking originals 1402 thereon, and the originals 1402 are stacked on the original tray 1401 with images to be read facing upward. The reference numeral 1403 denotes a sheet presence or absence detection sensor for detecting the presence or absence of the originals 1402 on the original tray 1401, and it is designed to use a photointerrupter and a mechanical flag to detect the state thereof. When the start of reading is executed with the originals 1402 stacked on the original tray 1401, a conveying roller 1404 is driven for only one full rotation by a solenoid, and only one of the originals is conveyed into the conveying path of the ADF 1202. The thus conveyed original 1402 is formed into a predetermined loop by a registration roller 1405, and the leading edge of the original 1402 conveyed into the ADF 1202 is detected by a leading edge detection sensor 1406. The reference numeral 1407 designates a photointerrupter which is an original leading edge detection sensor, and it is linked with the leading edge detection sensor 1406 by a mechanical flag, and design is made such that the leading edge of the original 1402 pushes out the mechanical flag, whereby the photointerrupter 1407 is shielded from light. The original 1402 is further conveyed into the interior of the ADF 1202 along the circumference of an original roller 1409 while being nipped between a first conveying roller 1408 and the original roller 1409 and between a supporting unit 1410 and the original roller 1409, and the reading of the image of the original 1402 is started at the timing whereat the original 1402 arrives at Mylar 1411. This timing is judged in a predetermined time after the leading edge detection sensor 1406 has detected the leading edge of the original, or if a stepping motor is used as the motor, by predetermined pulses having elapsed after the leading edge sensor 1406 has detected the leading edge of the original.

The original 1402 of which the image has been read from the leading edge is delivered onto a discharging tray 1413 by a second conveying roller 1412, and the reading of the first original is terminated.

The second and subsequent originals are fed in a predetermined time after the leading edge detection sensor 1406 has detected the leading edge of the original 1402, or if a stepping motor is used as a drive source for conveying sheets, a solenoid is driven at such timing that they are fed after the lapse of predetermined pulses, and the above-described control is continued until the sheet presence or absence detection sensor 1403 comes to detect no original on the original tray 1401.

Also, if there is no change in the result of detection even when a predetermined time has elapsed after the leading edge detection sensor 1406 has detected the leading edge of the original 1402, control is effected so that it may be treated as jam.

SUMMARY OF THE INVENTION

In the above-described conventional example, a reading mode conforming to the moving speed of the carriage is primarily determined, and users' broad needs could not be coped with completely. For example, among the users there are two kinds of users, i.e., users who want to give priority to resolution, and users who want to give priority to gradation, and reading modes desired by respective users could not be provided by a single product. An object of the present invention is to solve such a problem of the conventional example.

Another object of the present invention is to provide an image reading apparatus having:

a light source for applying light to an image;

moving means for moving a unit including at least the light source;

photoelectric converting means for converting the reflected light of the light source applied to an original into a voltage;

analog-digital converting means for converting an analog signal outputted from the photoelectric converting means into a digital signal; and a driving signal generating part for supplying a driving signal to the photoelectric converting means and the analog-digital converting means;

wherein the moving speed of the moving means is not changed, but there are held a plurality of kinds of signal patterns supplied by the driving signal generating part.

A further object of the present invention also provides an image reading apparatus having:

a light source for applying light to an image;

moving means for moving a unit including at least the light source;

photoelectric converting means for converting the reflected light of the light source applied to an original into a voltage;

analog-digital converting means for converting an analog signal outputted from the photoelectric converting means into a digital signal; and a plurality of amplifying means for amplifying a signal outputted from the analog-digital converting means;

wherein switch means is provided in the power source supplying part of predetermined one of the amplifying means, and a switch is ON/OFF-controlled in conformity with a reading mode.

Other objects, constructions and effects of the present invention will become apparent from the following detailed description and the accompanying drawings.

Figure 1:
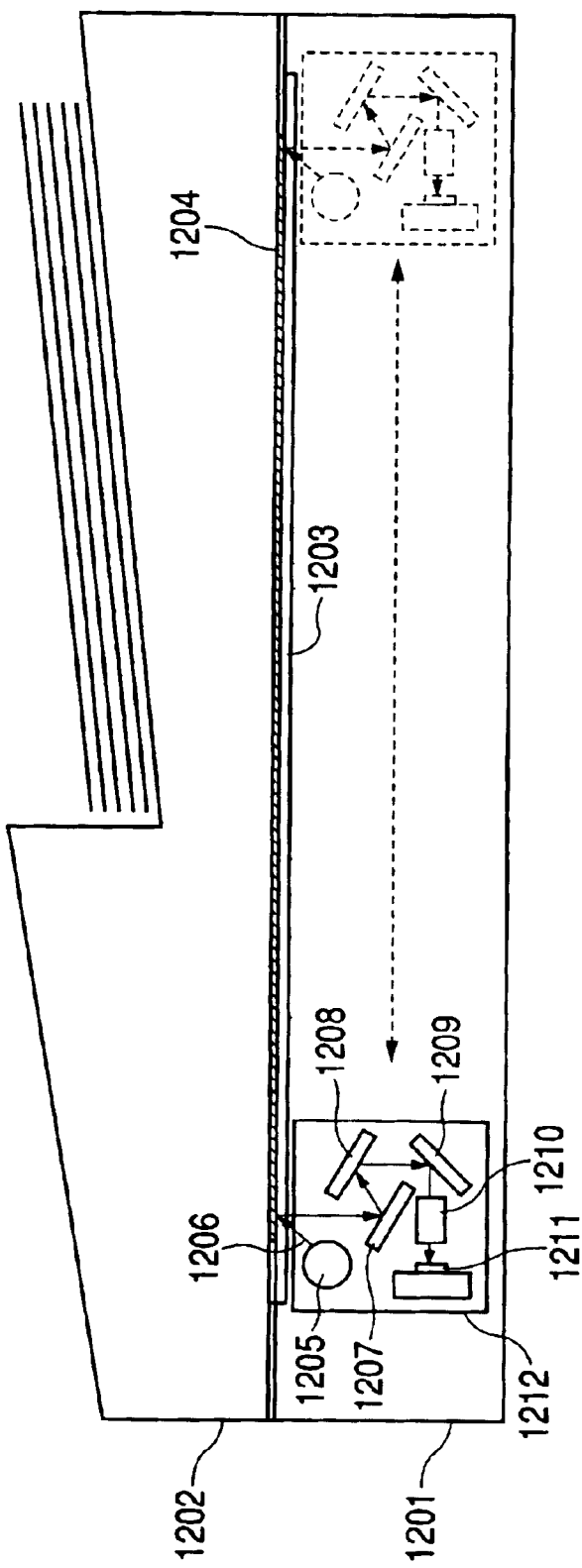
FIG. 1 shows the construction of an image reading apparatus for illustrating a first embodiment.

DETAILED DESCRIPTION OF THE PREFERRED EMBODIMENTS (First Embodiment)

A first embodiment of the present invention will hereinafter be described with reference to FIGS. 1 to 4. In this embodiment, the same constituents as those in the example of the prior art are given the same reference numerals.

In FIG. 1, the reference numeral 1201 designates an image scanner for reading an image, and the reference numeral 1202 denotes an ADF for automatically successively conveying a plurality of originals one by one.

The reference numeral 1203 in the image scanner designates copy board glass, and an original 1204 is placed on the copy board glass 1203 and a desired image is read. The procedure of reading the image will hereinafter be described briefly.

The reference numeral 1205 denotes a light source for applying light to the original, and generally when the read image is to be outputted in black and white, a yellow green light source is used, and when the read image is to be outputted in colors, a white light source is used. As the kinds of the light source, various kinds of light sources such as a cold cathode tube, a halogen lamp and a xenon lamp are used depending on the uses thereof.

Reflected light 1206 applied from the light source 1205 to the original 1204 is reflected by a first mirror 1207, a second mirror 1208 and a third mirror 1209, is condensed by a lens unit 1210 and is imaged on a CCD 1211 which is a photoelectric conversion element. The optical information of the imaged light is converted into a voltage by the CCD 1211, is further converted from an analog signal into a digital signal, and is subjected to a series of correcting processes such as shading correction, black level correction and gamma correction.

The one-dimensional information of the original 1204 read in this manner is sequentially read while a carriage unit 1212 is moved in the sub-scanning direction of the original by a motor (not shown), whereby it is connected together as two-dimensional information, and the entire original is read.

Figure 2:
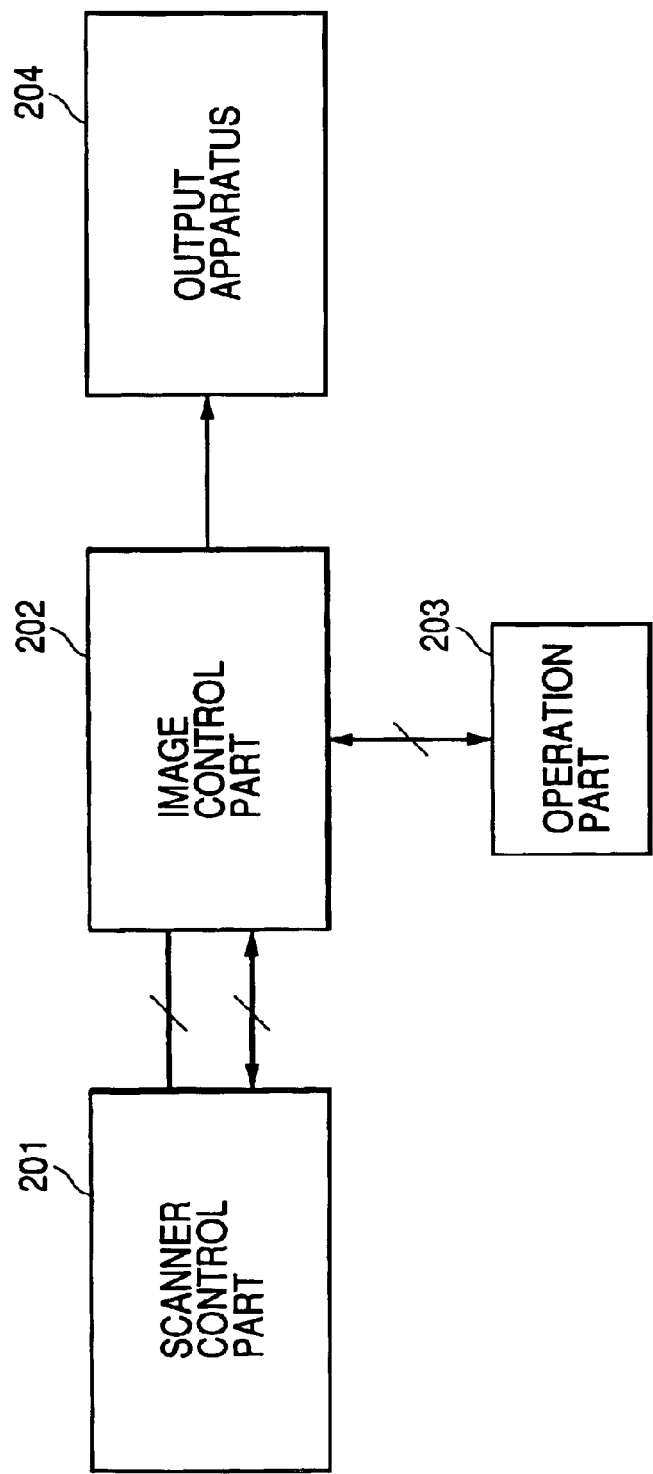
FIG. 2 is an electrical block diagram of the image reading apparatus for illustrating the first embodiment.
Figure 3:
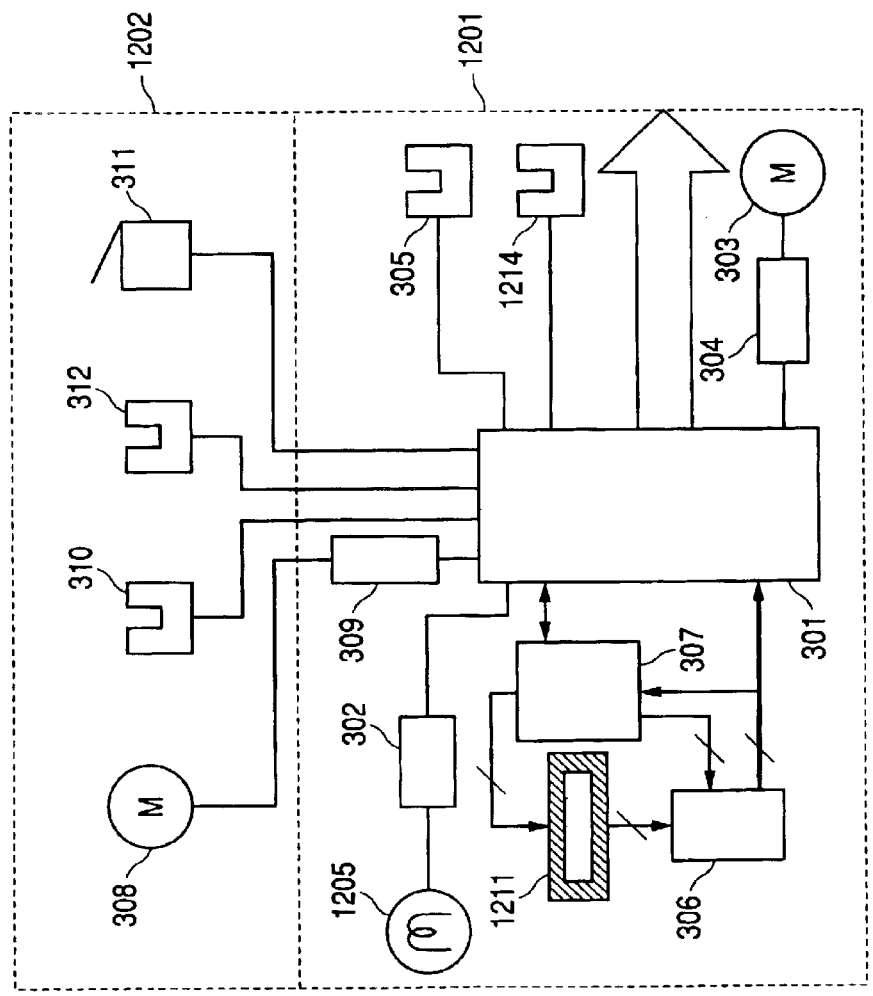
FIG. 3 is an electrical block diagram of a scanner control part for illustrating the first embodiment.

FIG. 2 is an electrical block diagram of the image scanner described with reference to FIG. 1. In FIG. 2, the reference numeral 201 designates a scanner control part which governs the control of an image reading system, and the reference numeral 202 denotes an image control part which governs various kinds of correction control such as shading correction and gamma correction, communication control with an external output apparatus such as a personal computer, and the control of an operation part 203 for a user to effect various kinds of setting, on the basis of an image signal transmitted from the scanner control part 201. FIG. 3 is a finer block diagram of the scanner control part 201, and in FIG. 3, the reference numeral 1201 designates the image scanner, the reference numeral 1202 denotes the ADF, and by what elements each of these is constituted is shown. The reference numeral 301 designates a CPU which governs the control of the entire electrical system of the image scanner 1201, and the CPU 301 has connected thereto an inverter 302 for boosting a DC voltage to control the turning-on the light source 1205 for applying light to the original 1204, and further converting the DC voltage into an AC voltage, a driver 304 for a motor 303 for moving a unit including the light source 1205 to thereby move the position of the light applied to the original 1204, a home position sensor 305 for detecting the reference position of the unit including the light source 1205, a driving signal generating part 307 for outputting a driving signal to the CCD 1211 for converting the reflected light applied from the light source 1205 to the original into a voltage and an A/D converter 306 for converting an analog voltage outputted from the CCD 1211 into a digital signal, an opening and closing detection sensor 1214 for detecting the opening and closing of the ADF 1202, and a driver 309 for the conveying motor 308 of the ADF 1202. In the ADF 1202, there are mounted an original detection sensor 310 for detecting the presence or absence of the original, the conveying motor 308, a solenoid 311 which provides a clutch for feeding originals one by one, and a leading edge detection sensor 312 for detecting the leading edge of the fed original, and these electrical parts in the ADF 1202 are also connected to and controlled by the CPU 301 in the image scanner 1201. Further, the CPU 301 introduces thereinto the image signal outputted from and converted into a voltage by the A/D converter 306, and transmits the image signal to the image control part 202 in synchronism with various kinds of timing signals.

Figure 4:
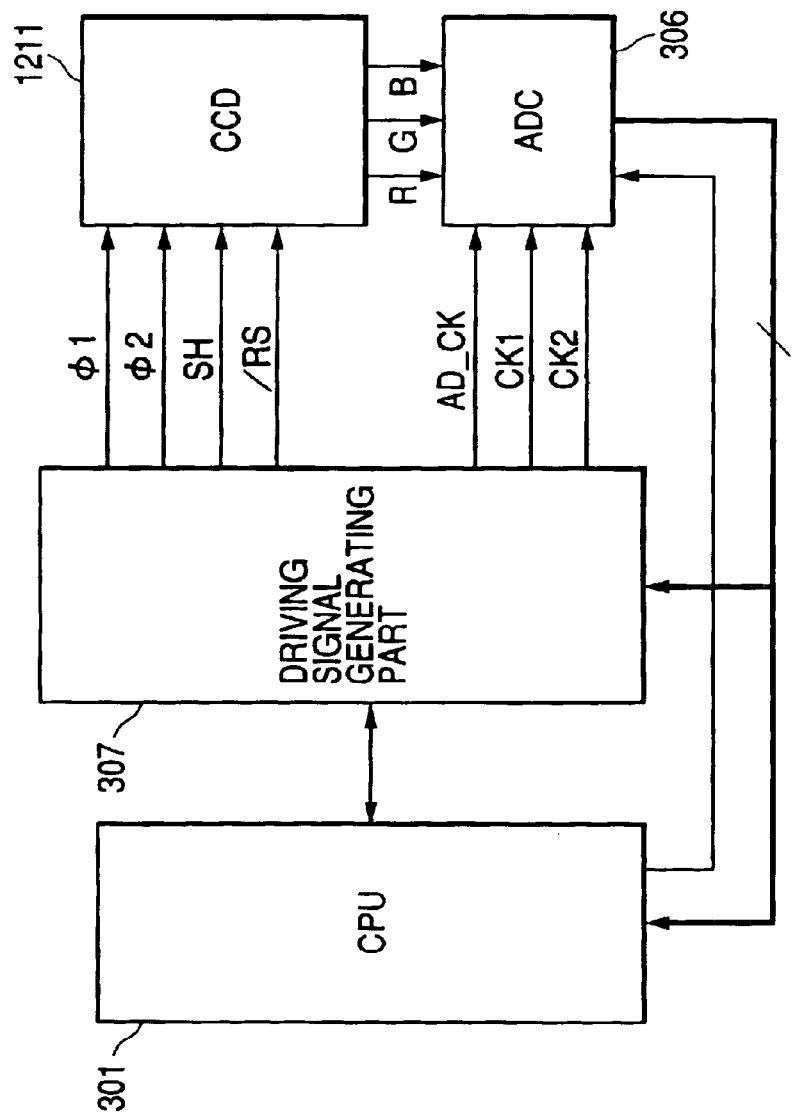
FIG. 4 is an electrical block diagram of the peripheral part of a CCD for illustrating the first embodiment.

FIG. 4 is a block diagram for illustrating the constructions of the CCD 1211, the A/D converter 306 and the driving signal generating part 307 in greater detail.

The CPU 301 effects serial communication with the driving signal generating part 307, and the setting of a reading mode selected by the user is transmitted from the CPU 301 to the driving signal generating part 307, which in turn transmits a driving signal conforming to the reading mode to the CCD 1211 and the A/D converter 306. Also, the driving signal generating part 307 stores black level/white level data transmitted from the A/D converter 306 in a memory in the driving signal generating part 307, and transmits the data stored in this memory to the CPU 301. The CPU 301 calculates the offset set in the A/D converter 306 and a gain value on the basis of the black level/white level data transmitted from the driving signal generating part 307, and transmits them to the A/D converter 306.

Figure 5:
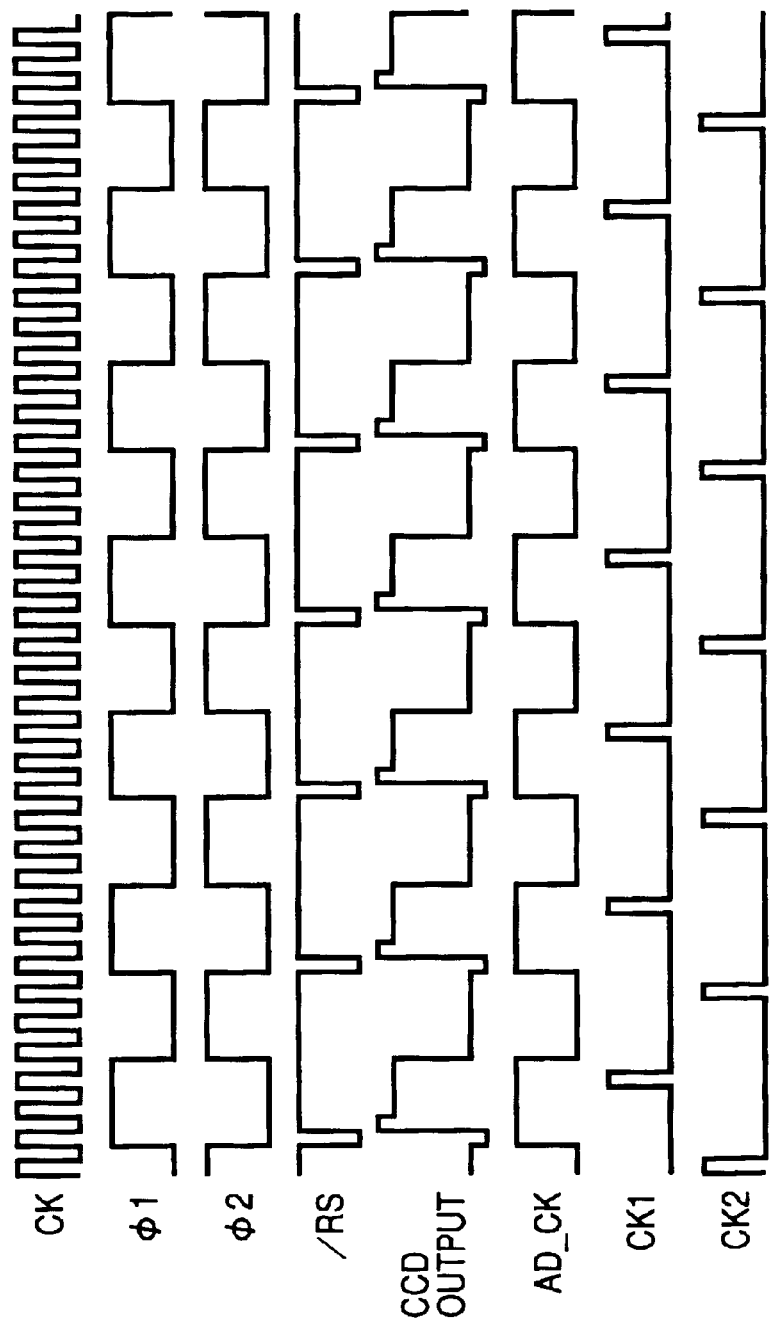
FIG. 5 is a timing chart of a resolution priority mode for illustrating the first embodiment.

The driving signal transmitted from the driving signal generating part 307 to the CCD 1211 and the A/D converter 306 assumes such timing as shown in FIG. 5. CK is a reference clock supplied to the driving signal generating part 307, $\phi1$ and $\phi2$ are the charge transmitting clocks of the CCD 1211, and 1RS is the reset clock of the CCD 1211. Also, AD_CK is the driving clock of the A/D converter 306, CK1 is a clock for sampling the reference level of the signal outputted from the CCD 1211, and CK2 is a clock for sampling the signal component of the signal outputted from the CCD 1211. Driving waveforms shown here are waveforms in a reading mode giving priority to resolution, and it is a feature of the present embodiment that besides this reading mode, a reading mode giving priority to gradation is set.

Figure 6:
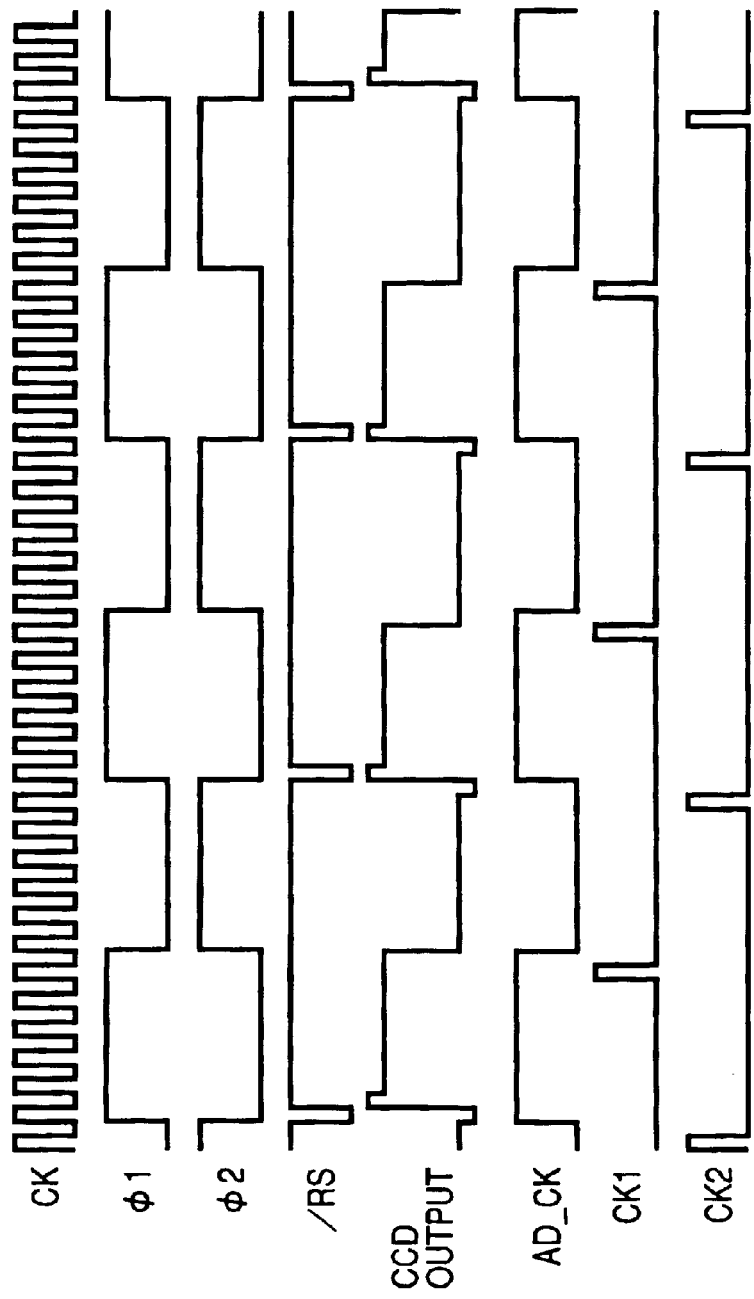
FIG. 6 is a timing chart of the gradation priority mode for illustrating the first embodiment.

FIG. 6 shows driving waveforms in the reading mode giving priority to gradation.

In FIG. 6, as compared with FIG. 5, it is seen that each driving waveform is a half relative to the frequency of the mode giving priority to resolution. Thus, again in the mode giving priority to gradation, the speed of the motor for moving the carriage is set to the same speed as in the mode giving priority to resolution, and the frequency of the clock supplied to the CCD and the A/D converter is set to a half in the mode giving priority to gradation relative to the mode giving priority to resolution, whereby the resolution in the sub-scanning direction in the mode giving priority to gradation becomes a half as compared with that in the mode giving priority to resolution. The resolution in the main scanning direction is uniformly determined by the resolving power of the CCD and is therefore invariable. Accordingly, if the resolution in the mode giving priority to resolution is 600 dpi in the main scanning direction and 600 dpi also in the sub-scanning direction, the resolution in the mode giving priority to gradation will be 600 dpi in the main scanning direction and 300 dpi in the sub-scanning direction.

On the other hand, when the reading speed in the sub-scanning direction is not changed but the resolution alone is changed to a half, an accumulation time for each pixel of the CCD becomes double. The fact that the accumulation time becomes double means that theoretically S/N also becomes double, and thus gradation increases by 1 bit.

As described above, by setting a reading mode in which the speed of the carriage for reading an image is not changed but the frequency of a clock supplied from the driving signal generating part to the CCD and the A/D converter is decreased to a half, it becomes possible to realize a reading mode giving priority to gradation. While in the present embodiment, description has been made of a case where the frequency of the clock supplied from the driving signal generating part to the CCD and the A/D converter is decreased to a half, of course a similar effect can be obtained even if the ratio of this frequency is decreased to 1/3, 1/4 or 1/2.5.

(Second Embodiment)

In the first embodiment, a reading mode giving priority to gradation has been realized by setting a reading mode in which the speed of the carriage for reading an image is not changed but the frequency of the clock supplied from the driving signal generating part to the CCD and the A/D converter is decreased to a half. The present embodiment is characterized in that attention is paid to a data width necessary for each of the mode giving priority to gradation and the mode giving priority to resolution, and when a driver at the rear stage of the A/D converter is unnecessary in the mode giving priority to resolution, the supply of electric power to the driver is cut off by switch means.

A second embodiment of the present invention will hereinafter be described with reference to FIGS. 7 to 9. In this embodiment, the same constituents as those in the example of the prior art and the first embodiment are given the same reference numerals.

Figure 7:
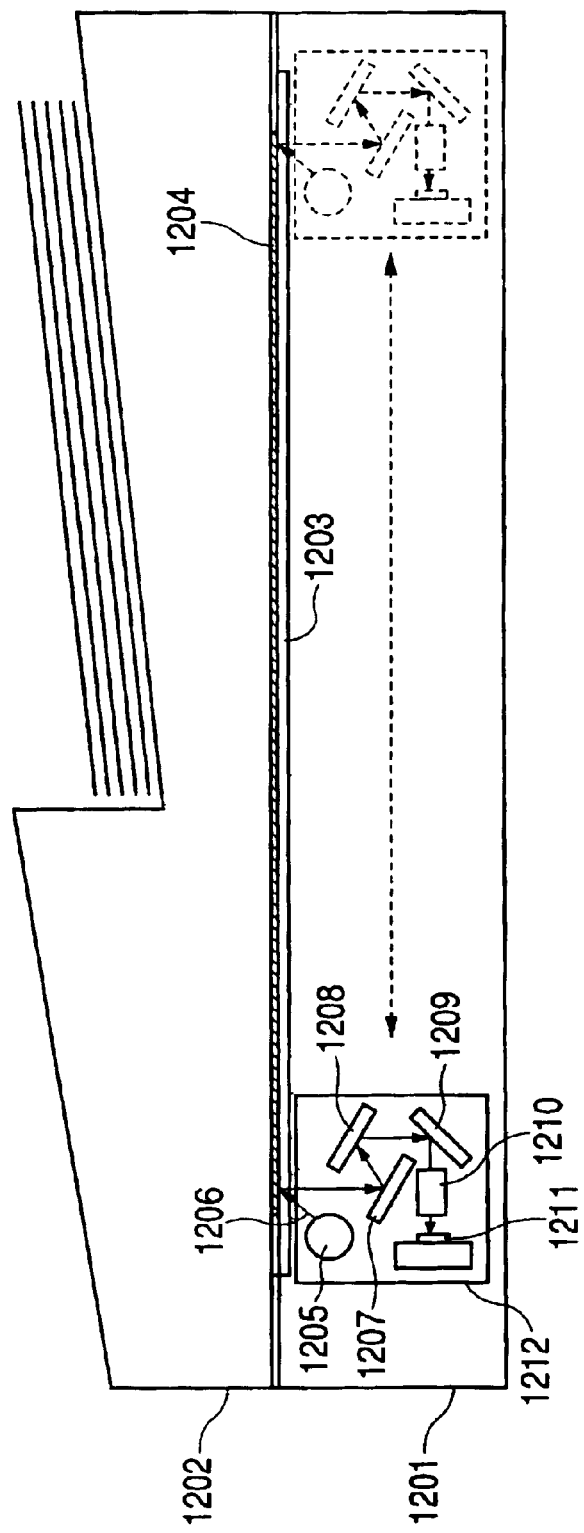
FIG. 7 shows the construction of an image reading apparatus for illustrating a second embodiment.

In FIG. 7, the reference numeral 1201 designates an image scanner for reading an image, and the reference numeral 1202 denotes an ADF for automatically successively conveying a plurality of originals one by one.

The reference numeral 1203 in the image scanner 1201 designates copy board glass, and an original 1204 is placed on the copy board glass 1203 and a desired image is read. The procedure of reading the image will hereinafter be described briefly.

The reference numeral 1205 denotes a light source for applying light to the original, and generally when the read image is to be outputted in black and white, a yellow green light source is used, and when the read image is to be outputted in colors, a white light source is used. As the kinds of the light source, various kinds of light sources such as a cold cathode tube, a halogen lamp and a xenon lamp, depending on the uses thereof.

Reflected light 1206 applied from the light source 1205 to the original 1204 is reflected by a first mirror 1207, a second mirror 1208 and a third mirror 1209, is condensed by a lens unit 1210 and is imaged on a CCD 1211 which is a photoelectric conversion element. The optical information of the imaged light is converted into a voltage by the CCD 1211, if further converted from an analog signal into a digital signal, and is subjected to a series of correcting processes such as shading correction, black level correction and gamma correction. The one-dimensional information of the original 1204 read in this manner is sequentially read while a carriage unit 1212 is moved in the sub-scanning direction of the original by a motor (not shown) and is thereby connected together as two-dimensional information, and the entire original is read.

Figure 8:
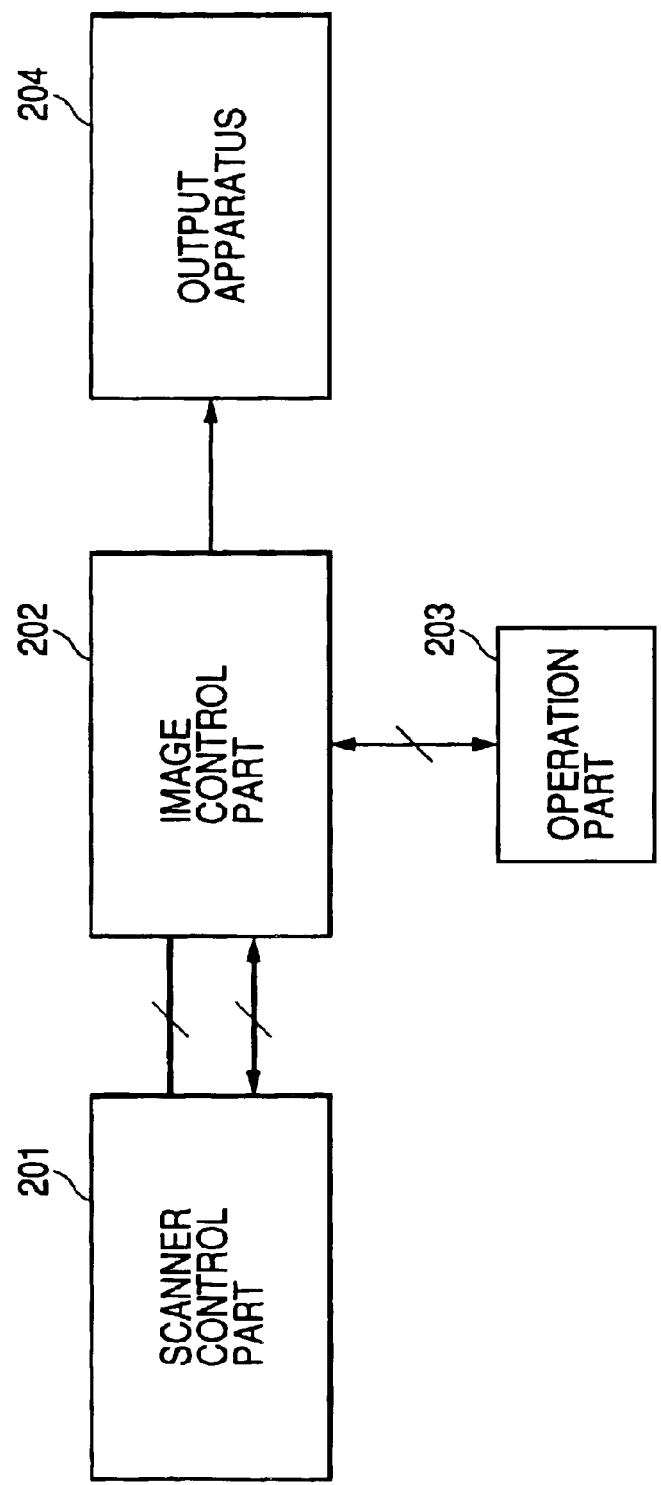
FIG. 8 is an electrical block diagram of the image reading apparatus for illustrating the second embodiment.
Figure 9:
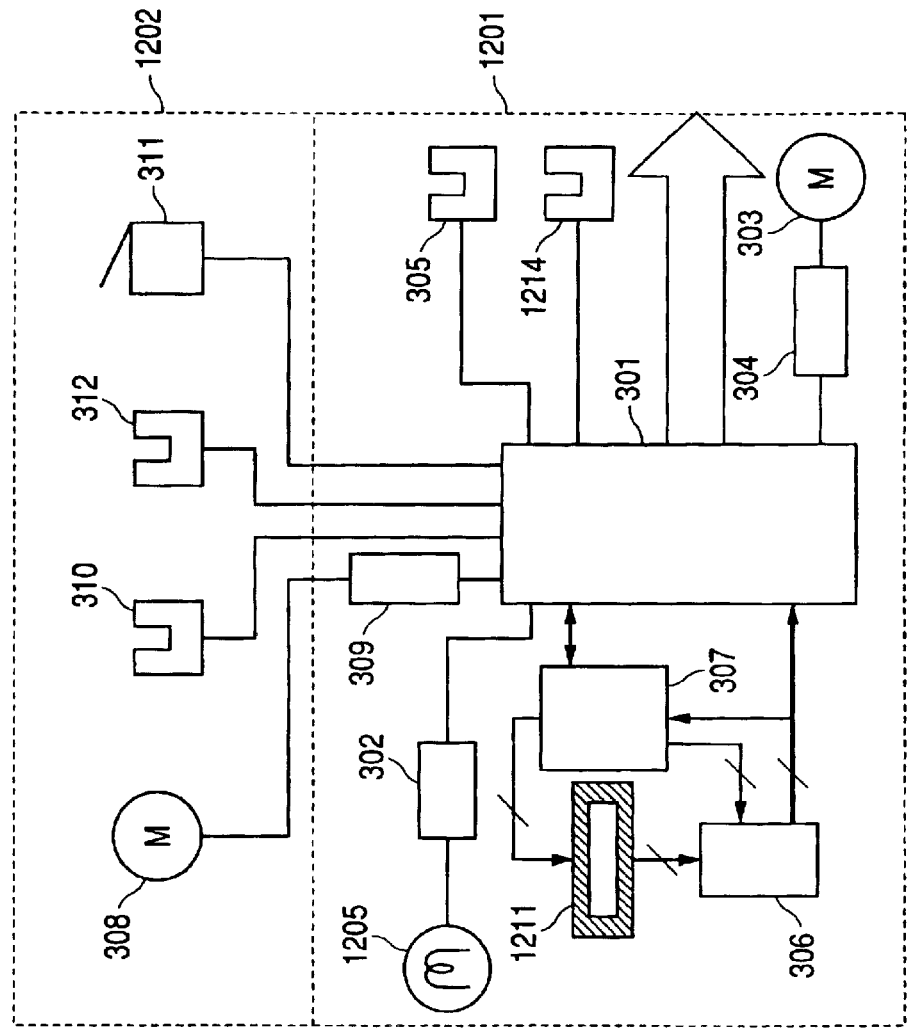
FIG. 9 is an electrical block diagram of a scanner control part for illustrating the second embodiment.

FIG. 8 is an electrical block diagram of the image scanner described with reference to FIG. 7. In FIG. 8, the reference numeral 201 designates a scanner control part which governs the control of an image reading system, and the reference numeral 202 denotes an image control part which governs various kinds of correction control such as shading correction and gamma correction and communication control with an external output apparatus such as a personal computer, and the control of an operation part 203 for the user to effect various kinds of setting, on the basis of an image signal transmitted from the scanner control part 1. FIG. 9 is a finer block diagram of the scanner control part 201 of FIG. 8, and in FIG. 9, the reference numeral 1201 designates the image scanner, and the reference numeral 1202 denotes the ADF, and by what elements each of these is constituted is shown. The reference numeral 301 designates a CPU which governs the control of the entire electrical system of the image scanner, and the CPU 301 has connected thereto an inverter 302 for boosting a DC voltage and further converting it into an AC voltage to control the turning-on of the light source 1205 for applying light to the original, a driver 304 for a motor 303 for moving a unit including the light source 1205 to thereby move the position of the light applied to the original, a home position sensor 305 for detecting the reference position of the unit including the light source 1205, a driving signal generating part 307 for outputting a driving signal to the CCD 1211 for converting the reflected light applied from the light source 1205 to the original and an A/D converter 306 for converting an analog voltage outputted from the CCD 1211 into a digital voltage, an opening and closing detection sensor 1214 for detecting the opening and closing of the ADF 1202, and a driven 309 for the conveying motor 308 of the ADF 202. Also, in the ADF 1202, there are mounted an original detection sensor 310 for detecting the presence or absence of the original, the conveying motor 308, a solenoid 311 which provides a clutch for feeding originals one by one, and a leading edge detection sensor 312 for detecting the leading edge of the fed original, and each of these electrical parts in the ADF 1202 is also connected to and controlled by the CPU 301 in the image scanner 1201. Further, the CPU 301 introduces thereinto an image signal outputted from the A/D converter 306 and converted into a voltage, and transmits the image signal to the image control part 202 in synchronism with various kinds of timing signals.

Figure 10:
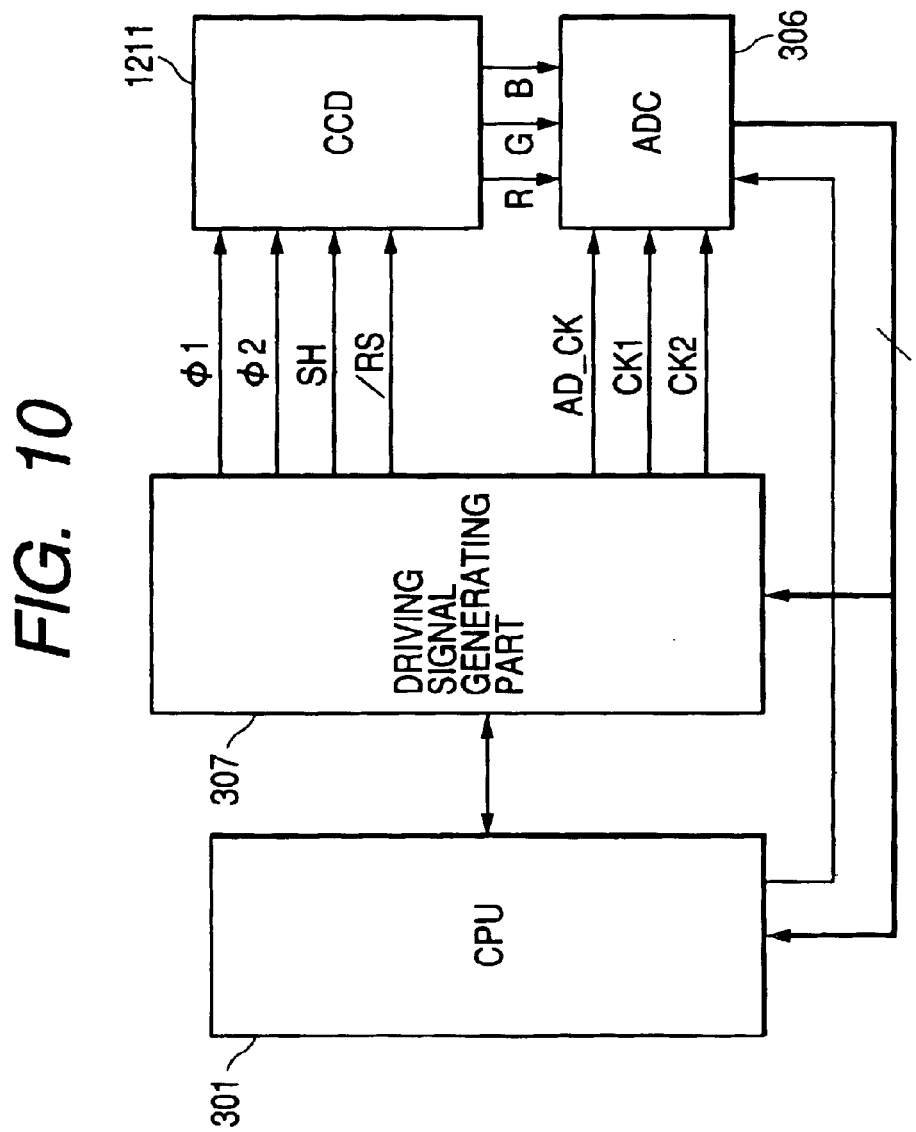
FIG. 10 is an electrical block diagram of the surrounding parts of a CCD for illustrating the second embodiment.

FIG. 10 is a block diagram for illustrating the constructions of the CCD 1211, the A/D converter 306 and the driving signal generating part 307 in greater detail.

The CPU 301 effects serial communication with the driving signal generating part 307, and the setting of a reading mode is transmitted from the CPU301 to the driving signal generating part 307, which in turn transmits a driving signal conforming to the reading mode to the CCD 1211 and the A/D converter 306. Also, the driving signal generating part 307 stores black level/white level data transmitted from the A/D converter 306 in a memory in the driving signal generating part 307, and effects the calculation of the average value of the optical black portion image data of the CCD 1211 and the holding of the peak value of effective pixel range data on the basis the aforementioned black level/white level data, and transmits the result thereof to the CPU 301. The CPU 301 calculates the offset set in the A/D converter 306 and a gain value on the basis of the data transmitted from the driving signal generating part 307, and transmits them to the A/D converter 306.

Figure 11:
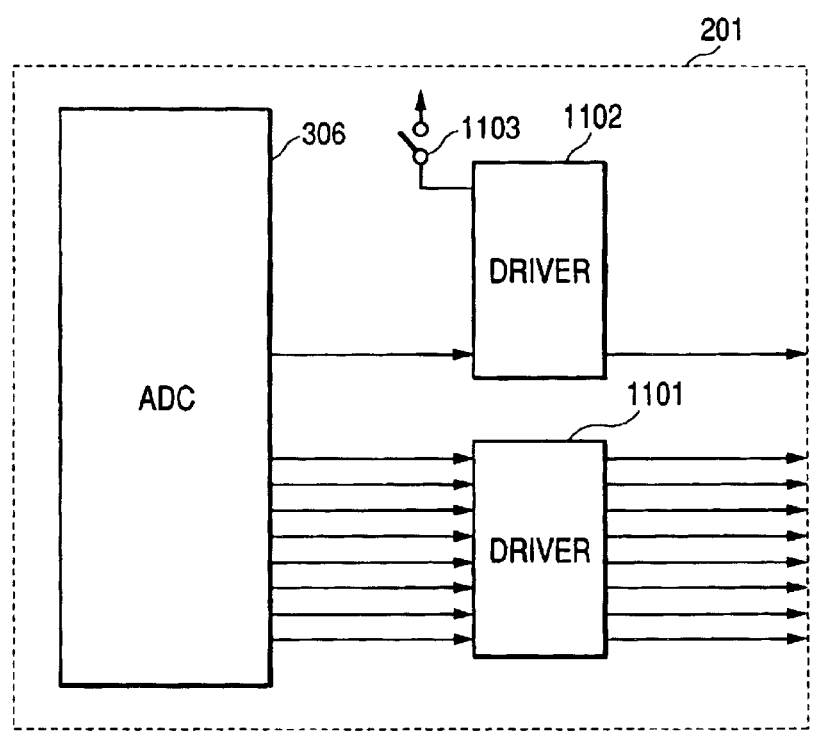
FIG. 11 is an electrical block diagram of an ADC output part for illustrating the second embodiment.
Figure 12:
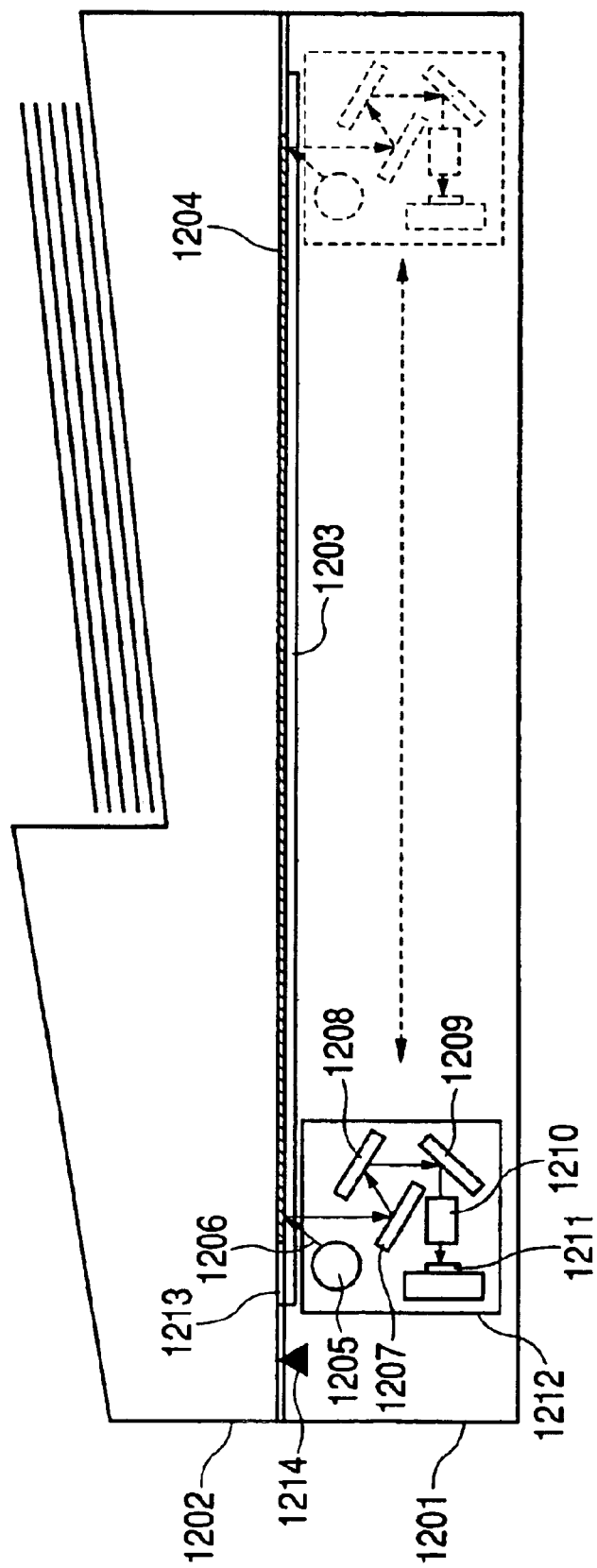
FIG. 12 shows the construction of an integral optical system in an image reading apparatus for illustrating the conventional type of the apparatus.
Figure 13:
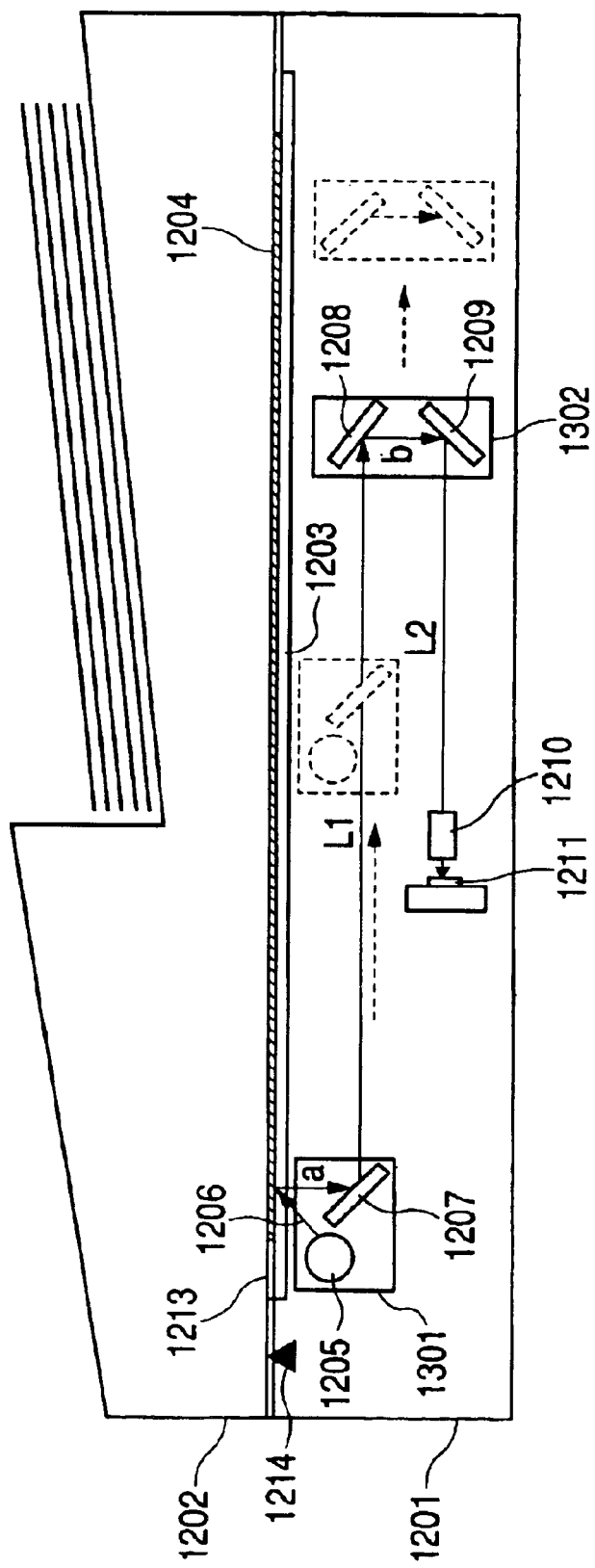
FIG. 13 shows the construction of a 1 to ½ optical system in the image reading apparatus for illustrating the conventional type of the apparatus.
Figure 14:
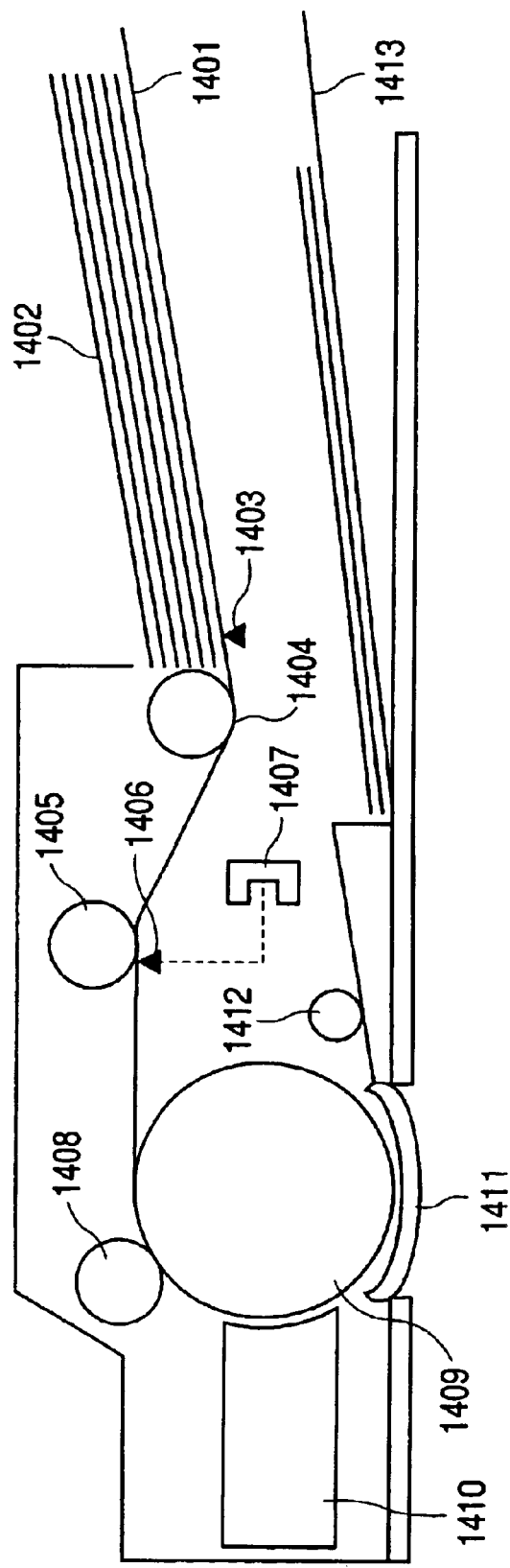
FIG. 14 shows the construction of an ADF in the image reading apparatus for illustrating the conventional type of the apparatus.

FIG. 11 is a block diagram showing the flow of the data of the scanner control part and the image processing part. In FIG. 11, an area encircled by broken line is the scanner control part 201, and data conforming to the image signal is outputted from the A/D converter 306 mounted in the scanner control part 201, and is usually outputted in parallel as shown. The data outputted from the A/D converter 306 is once inputted to drivers 1101 and 1102, and is further outputted to the image control part (not shown).

Here, when the mode giving priority to gradation handles 9-bit data, the mode giving priority to resolution handles 8-bit or less data, and when the operation is going on in the mode giving priority to resolution, the driven 1102 becomes unnecessary. Therefore, switch means 1103 is provided in the power supply line of the driver to control so that during the mode giving priority to gradation, the switch may be brought into ON state to thereby supply the power source of the driver, and during the mode giving priority to resolution, the switch may be brought into OFF state to thereby cut off the power source of the driver.

As described above, the switch means is provided in the power supply line of the driver to control so that during the mode giving priority to gradation, the switch may be brought into ON state to thereby supply the power source of the driver, and during the mode giving priority to resolution, the switch may be brought into OFF state to thereby cut off the power source of the driver, whereby a consumed electric current in each reading mode can be optimally controlled.

As has hitherto been described, an aspect of the image reading apparatus is an image reading apparatus having a light source for applying light to an image, moving means for moving a unit including at least the light source, photoelectric converting means for converting the reflected light of the light source applied to an original into a voltage, analog-digital converting means for converting an analog signal outputted from the photoelectric converting means into a digital signal, and a driving signal generating part for supplying a driving signal to the photoelectric converting means and the analog-digital converting means, characterized in that the moving speed of the moving means is not changed, but there are held a plurality of kinds of signal patterns supplied by the driving signal generating part, and a single product can cope with the needs of a user demanding the priority of resolution and a user demanding the priority of gradation.

Another aspect of the image reading apparatus is an image reading apparatus having a light source for applying light to an image, moving means for moving a unit including at least the light source, photoelectric converting means for converting the reflected light of the light source applied to an original into a voltage, analog-digital converting means for converting an analog signal outputted from the photoelectric converting means into a digital signal, and a plurality of amplifying means for amplifying a signal outputted from the analog-digital converting means, characterized in that switch means is provided in the power source supplying part of predetermined one of the amplifying means, and a switch is ON/OFF-controlled in conformity with a reading mode, and optimum electric power consumption conforming to image data becomes possible.

While the present invention has been described above with respect to some preferred embodiments thereof, the present invention is not restricted to these embodiments, but it is apparent that various modifications and applications are possible within the scope of the invention as defined in the appended claims.

What is claimed is:

1. An image reading apparatus having a first mode for high resolution reading and a second mode for high gradation reading, said apparatus comprising:

a light source adapted to apply light to an original image;

a movable reading unit adapted to convert reflected light of said light source applied to the original image into a voltage;

a moving unit adapted to move a reading position of said reading unit at a speed which is the same for the first mode for high resolution reading and the second mode for high gradation reading;

a generator adapted to generate a driving signal for said reading unit, said signal having patterns which are varied in accordance with said reading modes, wherein a frequency of the driving signal in the second mode for high gradation reading is lower than a frequency of the driving signal in the first mode for high resolution reading, and an accumulation time of each of pixels of the driving signal in the second mode for high gradation reading is longer than an accumulation time of each of pixels of the driving signal the driving signal in the first mode for high resolution reading; and a converter adapted to convert analog signals from said reading unit to a digital signal having a plurality of numbers of bits, wherein a number of bits in the second mode for high gradation reading is higher than a number of bits in the first mode for high resolution reading.

2. An image reading apparatus according to claim 1, wherein said reading unit includes a CCD, and the driving signal includes a charge transfer clock signal and a reset clock signal of the CCD.

3. An image reading apparatus according to claim 2, wherein the driving signal further includes a clock signal to sample a signal for the CCD and a clock signal to sample a reference level.

4. An image reading apparatus according to claim 1, wherein the moving unit moves a carriage unit including said light source and said reading unit with a motor.

5. An image reading apparatus according to claim 1, further comprising a processor adapted to execute a shading correction to a digital signal output from said converter.

* * * * *

UNITED STATES PATENT AND TRADEMARK OFFICE
CERTIFICATE OF CORRECTION

PATENT NO. : 6,979,809 B2 Page 1 of 1
DATED : December 27, 2005
INVENTOR(S) : Nobuyuki Uchiyama It is certified that error appears in the above-identified patent and that said Letters Patent is hereby corrected as shown below:

<u>Column 5,</u>
Line 22, "setting," should read -- settings, --.

<u>Column 7,</u>
Line 51, "setting," should read -- settings, --.

<u>Column 10,</u>
Line 15, "the driving signal" (second occurrence) should be deleted.

Signed and Sealed this

Sixth Day of June, 2006

JON W. DUDAS
*Director of the United States Patent and Trademark Office*